United States Patent [19]

Sumiyoshi et al.

[11] 4,210,713
[45] Jul. 1, 1980

[54] PHOTO-CURABLE COMPOSITION FOR COATING CONTAINING AN UNSATURATED URETHANE MODIFIED POLYMER

[75] Inventors: Iwao Sumiyoshi, Osaka; Tamio Iimure, Suita; Akio Tomotsugu, Osaka, all of Japan

[73] Assignee: Nippon Paint Co., Ltd., Osaka, Japan

[21] Appl. No.: 902,817

[22] Filed: May 4, 1978

Related U.S. Application Data

[63] Continuation-in-part of Ser. No. 648,805, Jan. 13, 1976, abandoned, which is a continuation-in-part of Ser. No. 437,217, Jan. 28, 1974, abandoned.

[30] Foreign Application Priority Data

Feb. 1, 1973 [JP] Japan ................................. 48-13288

[51] Int. Cl.² .................... G03C 1/68; C08G 18/00
[52] U.S. Cl. ............................ 430/284; 204/159.19; 430/281; 430/286; 430/288; 528/75
[58] Field of Search ............... 96/115 P, 77.5; 528/75; 204/159.19

[56] References Cited

U.S. PATENT DOCUMENTS

| | | | |
|---|---|---|---|
| 3,278,305 | 10/1966 | Caridon et al. | 96/115 R |
| 3,505,252 | 4/1970 | Brotherton et al. | 260/77.5 AT |
| 3,658,531 | 5/1972 | Kurtz | 96/115 R |
| 3,732,106 | 5/1973 | Steppan | 96/115 R |
| 3,832,421 | 7/1974 | Morgan | 96/115 R |
| 3,928,299 | 12/1975 | Rosenkranz et al. | 96/115 R |

*Primary Examiner*—Jack P. Brammer
*Attorney, Agent, or Firm*—Wenderoth, Lind & Ponack

[57] ABSTRACT

A photo-curable coating composition having a high hiding power which comprises (1) a photo-curable, urethane-modified polymer having at least one unsaturation originated in the acrylate or methacrylate moiety and a molecular weight of which the proportion to the number of said unsaturation is 200–10,000, (2) an $\alpha,\beta$-ethylenically unsaturated compound copolymerizable with said acrylate or methacrylate moiety, (3) a photosensitizer, and (4) a coloring agent.

13 Claims, No Drawings

PHOTO-CURABLE COMPOSITION FOR COATING CONTAINING AN UNSATURATED URETHANE MODIFIED POLYMER

CROSS-REFERENCE TO RELATED APPLICATIONS

This is a continuation-in-part of U.S. application Ser. No. 648,805, filed Jan. 13, 1976, now abandoned which in turn is a continuation-in-part of U.S. application Ser. No. 437,217, filed Jan. 28, 1974, now abandoned.

SUMMARY OF THE INVENTION

The present invention relates to a photo-curable composition for coating. More particularly, it relates to a photo-curable composition for coating which can afford a coating film having a high hiding power.

DESCRIPTION OF THE PRIOR ART

As the photo-curable composition, there are known a transparent composition (clear) comprising an unsaturated polyester resin (i.e. polyester obtained from maleic acid or fumaric acid and propylene glycol), an $\alpha,\beta$-ethylenically unsaturated compound and a photo-sensitizer and a translucent composition comprising the said transparent composition and an extender pigment having a high ultraviolet ray transmittance, if necessary, together with a small amount of a coloring agent such as a pigment. These compositions are generally poor in hiding power and used as a transparent topcoat finishing or a translucent undercoat finishing on woods, papers, plastics or other subtrates.

In order to provide the said compositions with a high hiding power, a coloring agent having a low ultraviolet ray transmittance is incorporated therein to prepare a paint (enamel). Since, however, ultraviolet rays can hardly go through the coating layer of such paint formed on a substrate to reach the lower part due to the reflection and absorption of the ultraviolet rays by the coloring agent, a difference in curing is produced between the surface and the lowest part of the coating layer. When the thickness of the coating layer is small or the content of the coloring agent is low, the difference may be negligible, and any drawback is not practically produced. When, however, the thickness of the coating layer or the content of the coloring agent is considerable, the difference is remarkable, and the surface of the coating layer becomes not smooth and affords a crepelike appearance or rough wrinkles. Further, the physical properties of the coating layer such as the adhesiveness to the substrate are deteriorated. Furthermore, the water resistance, the resistance to chemicals (e.g. aqueous alkali) and the like are made inferior.

For overcoming the drawbacks as above, the use of a polymerization initiator such as an organic peroxide and/or a polymerization promoter such as a metal salt together with a photo-sensitizer has been proposed. However, this proposal is not practicable, because the said agents cause new drawbacks, e.g. lowering the stability of the resulting composition on storage or requiring to formulate such composition in a two package type.

As the result of the extensive study to achieve a well balanced curing rate between the surface and the lowest part of the coating layer, it has been found that the use of a photo-curable, urethane-modified polymer having at least one unsaturation of the acrylate or methacrylate moiety in the side chain and a molecular weight of which the proportion to the number of said unsaturation is 200–10,000 as the polymer component can realize the formation of a coating film having high hiding power and satisfactory physical properties without any polymerization initiator and/or polymerization promoter. This invention is based on the above finding.

DESCRIPTION OF THE PREFERRED EMBODIMENTS

According to the present invention, there is provided a photo-curable coating composition which comprises (1) a photo-curable, urethane-modified polymer having at least one unsaturation of the acrylate or methacrylate (hereinafter referred to as "(meth)acryloyl") moiety in the side chain and a molecular weight of 200–10,000 per each of said unsaturation, (2) an $\alpha,\beta$-ethylenically unsaturated compound copolymerizable with said acrylate or methacrylate moiety, (3) a photo-sensitizer, and (4) a coloring agent.

The photo-curable, urethane-modified polymer as the component (1) can be prepared by reacting (A) an isocyanate compound having at least one unsaturation of the (meth)acrylate moiety with (B) a polymer having at least one active hydrogen atom.

The isocyanate compound (A) is obtainable by reacting (C) a (meth)acrylate compound having at least one (meth)acrylate moiety and at least one active hydrogen atom with (D) a polyfunctional isocyanate having isocyanate groups bonded directly to the carbon atom.

The polymer (B) is intended to mean not only a polymer in the strict sense but also a pre-polymer, inclusively.

In the preparation of the isocyanate compound (A), the reaction between the (meth)acrylate compound (C) and the polyfunctional isocyanate having isocyanate groups bonded directly to the carbon atom (D) is usually effected at a temperature of 30° to 130° C. (preferably 30° to 70° C.), if necessary, in the presence of 100 to 5,000 ppm (preferably 500 to 2,000 ppm) of a conventional polymerization inhibitor (e.g. hydroquinone, hydroquinone monomethyl ether, benzoquinone, nitrobenzene, diphenylpicrylhydrazyl, galvanozyl) and of 100 to 5,000 ppm (preferably 500 to 2,000 ppm) of a conventional urethanation (i.e. urethane-formation) catalyst such as a tertiary amine (e.g. triethylamine, N-methylmorpholine) or an organotin compound (e.g. stannous octanoate, dibutyltin dilaurate, distannoxane) until one isocyanate group remains in each molecule of the produced isocyanate compound (A) in average. The presence of the isocyanate group may be confirmed by a conventional amine back titration procedure or by the absorption at around 2,200 cm$^{-1}$ in the infrared absorption spectrum. Sometimes, a part of the polyfunctional isocyanate having isocyanate groups bonded directly to the carbon atom (D) may remain unreacted, or any compound containing no isocyanate group may be by-produced in the reaction. The reaction product containing these contaminants may be as such subjected to the subsequent reaction with the polymer (B). However, when an acrylic polymer is used as the said polymer, the elimination of these contaminants by a conventional procedure (e.g. extraction, distillation, adsorption) is often desired.

The reaction of the thus obtained isocyanate compound (A) with the polymer (B) may be carried out until the proportion of the molecular weight of the produced polymer as the compound (1) to the number of the unsaturation of the (meth)acrylate moiety in such polymer becomes 200–10,000, preferably 500–5,000. When the proportion is smaller than 200, the coating film produced by the use of the resulting polymer has a poor flexibility. When larger than 10,000, the film is not only hardly cured but also has a low hiding power. If desired, the reaction may be performed in the presence of a polymerization inhibitor and an urethanation catalyst as mentioned above. The reaction temperature is usually from 30° to 130° C., preferably from 60° to 120° C. The isocyanate group can be detected by the method as above mentioned. Optionally, an α,β-ethylenically unsaturated compound having no active hydrogen atom sensitive to the isocyanate group (e.g. methyl methacrylate) may be incorporated into the reaction system.

As the (meth)acrylate compound (C), the use of the one having only one active hydrogen atom in the molecule is favored. Particularly favored are those having at least one (meth)acrylate moiety and a hydroxyl group wherein only one active hydrogen atom exists or any group readily convertible thereto under the reaction condition. Specific examples are as follows:

(1) Compounds having a hydroxyl group such as mono(meth)acrylic esters of alkanepolyols (preferably having not more than 10 carbon atoms and not more than 10 hydroxyl groups) (e.g. hydroxyethyl (meth)acrylate, hydroxypropyl (meth)acrylate, 1,4-butanediol mono(meth)acrylate, pentaerythritol tri(meth)acrylate) and mono(meth)acrylic esters of polyalkylene glycols (preferably having a molecular weight of not more than 400) (e.g. polyethylene glycol mono(meth)acrylate, polypropylene glycol mono(meth)acrylate);

(2) Compounds such as mono(meth)acrylic esters of N-alkylated dialkanolamines (preferably having not more than 10 carbon atoms) (e.g. mono(meth)acrylic ester of N-methyldiethanolamine, mono(meth)acrylic ester of N-ethyldiethanolamine;

(3) Reaction products of (meth)acrylic acid with monoepoxy compounds (preferably having a molecular weight of not more than 400) (e.g. glycidyl (meth)acrylate, glycidyl tertiary alkanoates ("Cardura E" manufactured by Shell Chemical Corp.), n-butyl glycidyl ether, allyl glycidyl ether);

(4) Reaction products of glycidyl (meth)acrylate with monocarboxylic acids (preferably having a molecular weight of not more than 300) (e.g. acetic acid, butyric acid, benzoic acid) or secondary monoamines (preferably having a molecular weight of not more than 500) (e.g. dimethylamine, diethylamine, piperidine, methylaniline), etc.

As the polyfunctional isocyanate having isocyanate groups bonded directly to the carbon atom (D), there may be employed any conventional one, and their examples are as follows: diisocyanates and triisocyanates (e.g. ethylene diisocyanate, propylene diisocyanate, tetramethylene diisocyanate, hexamethylene diisocyanate, 1-methyl-2,4-diisocyanatocyclohexane, 1-methyl-2,6-diisocyanatocyclohexane, ω,ω'-diisocyanatodiethylbenzene, ω,ω'-diisocyanatodimethyltoluene, ω,ω'-diisocyanatodimethylxylene, ω,ω'-diisocyanatodiethylxylene, lysine diisocyanate, 4,4'-methylenebis(cyclohexyl isocyanate), 4,4'-ethylenebis(cyclohexyl isocyanate), ω,ω'-diisocyanato-1,3-dimethylbenzene, ω,ω'-diisocyanato-1,4-dimethylbenzene, isophorone diisocyanate, 2,4-tolylene diisocyanate, 2,6-tolylene diisocyanate, 1,5-naphthylene diisocyanate, 4,4'-methylenebis(phenylisocyanate), triphenylmethane triisocyanate); their polymers such as dimers and trimers; their addition products to low molecular weight polyols (e.g. ethyleneglycol, propyleneglycol, 1,3-butyleneglycol, 2,2,4-trimethyl-1,3-pentanediol, hexamethyleneglycol, cyclohexanedimethanol, trimethylolpropane, hexanetriol, glycerol, sorbitol, sortitan, sucrose, pentaerythritol); polyisocyanates having a biuret structure or an allophanate structure, etc.

These polyfunctional isocyanates may be used alone or in combination. Among them, the use of a diisocyanate or a triisocyanate is favorable.

The partial urethanation reaction of the diisocyanate or triisocyanate with the low molecular weight polyol may be effected in the presence of an urethanation catalyst as employed in the similar manner to the preparation of the isocyanate compound (A).

As the polymer (B), there may be used the one usually employed in the preparation of a polyurethane compound by the reaction with an isocyanate. There may be also used the one in which an α,β-ethylenic unsaturation has been already introduced by a conventional procedure. Examples of such polymer are as follows:

(1) Polyetherpolyols (preferably having a molecular weight of about 500 to 10,000) obtained by the addition of an alkylene oxide (e.g. ethylene oxide, propylene oxide, tetrahydrofuran) to a polyol (e.g. ethyleneglycol, diethyleneglycol, propyleneglycol, dipropyleneglycol, glycerol, trimethylolpropane, 1,3-butanediol, 1,4-butanediol, 1,6-hexanediol, 1,2,6-hexanetriol, pentaerythritol, sorbitol, sorbitan, sucrose);

(2) Polyesterpolyols (preferably having a molecular weight of about 500 to 10,000) obtained by the reaction of the above mentioned polyol with an epoxy compound (e.g. "Cardura E", n-butyl glycidyl ether, allyl glycidyl ether, di(methylglycidyl) esters of dicarboxylic acids and their derivatives ("Epiclon" manufactured by Dainippon Ink & Chemicals Inc.)) and a polycarboxylic acid or its anhydride or ester (e.g. adipic acid, succinic anhydride, maleic anhydride, phthalic anhydride, tetrahydrophthalic anhydride, terephthalic acid, itaconic acod) or the reaction of the above mentioned polyol or epoxy compound with the polycarboxylic acid or its anhydride or ester;

(3) Polyesterpolyols containing an α,β-ethylenically unsaturated group (preferably having a molecular weight of about 500 to 10,000) obtained by the reaction of a polyesterpolyol containing a carboxyl group with an, α-βethylenically unsaturated epoxy compound (e.g. glycidyl methacrylate) or the reaction of a polyesterpolyol containing a glycidyl group with an α,β-ethylenically unsaturated carboxylic acid (e.g. acrylic acid, methacrylic acid);

(4) Polymers obtained by the ring opening of cyclic esters having a molecular weight of about 500 to 4,000 (e.g. polycaprolactone, polybutyrolactone);

(5) Esters (preferably having a molecular weight of about 500 to 4,000) obtained by the esterification of a polyol with a higher fatty acid (e.g. mono-, di- or triethyleneglycol mono- or di-ricinoleate, 1,2,6-hexanetriol mono-, di- or tri-ricinoleate, trimethylolpropane mono-, di- or tri-ricinoleate, pentaerythritol mono-, di, tri- or tetra-ricinoleate, castor oil, hydrogenated caster oil, castor oil fatty acid mono- or di-glyceride, hydrogenated castor oil fatty acid mono- or di-glyceride);

(6) Acrylic polyols (preferably having a molecular weight of about 500 to 30,000) such as homopolymers of alkyleneglycol monoacrylate or monomethacrylate and copolymers of them with α,β-ethylenically unsaturated compounds (e.g. styrene, dibutyl fumarate, acrylic acid, methacrylic acid, acrylic ester, methacrylic ester, glycidyl methacrylate, ethylene, propylene, vinyl chloride, vinylidene chloride, butadiene, isoprene, vinyl acetate);

(7) Acrylic polyols (preferably having a molecular weight of about 500 to 30,000) containing an $\alpha,\beta$-ethylenic unsaturation obtained by the half esterification of an acrylic polyol with an $\alpha,\beta$-ethylenically unsaturated polycarboxylic anhydride (e.g. maleic anhydride, itaconic anhydride);

(8) Acrylic polyols (preferably having a molecular weight of about 500 to 30,000) containing an unsaturation of the (meth)acrylate moiety obtained by the esterification of the carboxyl group at the side chain of an acrylic polyol with an $\alpha,\beta$-ethylenically unsaturated epoxy compound (e.g. glycidyl (meth)acrylate);

(9) Acrylic polyols (preferably having a molecular weight of about 500 to 30,000) containing an unsaturation of the (meth)acrylate moiety obtained by the esterification of the glycidyl group at the side chain of an acrylic polyol with an $\alpha,\beta$-ethylenically unsaturated carboxylic acid (e.g. acrylic acid, methacrylic acid);

(10) Polyurethanepolyols obtained by the urethanation of the above mentioned polyetherpolyol, polyesterpolyol or the like with a polyisocyanate having isocyanate groups bonded directly to the carbon atom;

(11) Anion polymerization products (preferably having a molecular weight of about 500 to 10,000) substituted with a functional group having an active hydrogen atom at the end of the molecule (e.g. polyethylenediol, polybutadienediol, polystyrenediol, diols of copolymers of the monomeric constituents of the above polymers);

(12) Saponification products of copolymers of vinyl esters (e.g. vinyl acetate) with vinylpyrrolidone, polyamidopolyamine and polyethyleneimine.

Among the above mentioned polymers, the polyesterpolyols and the acrylic polyols are particularly favorable.

Examples of the $\alpha,\beta$-ethylenically unsaturated compound as the component (2) are as follows:

(1) Styrene and its derivatives such as vinyltoluene, t-butylstyrene, monochlorostyrene, $\alpha$-methylstyrene and divinylbenzene;

(2) Vinyl esters such as vinyl acetate, vinyl propionate, vinyl butyrate and vinyl benzoate;

(3) (Meth)acrylates such as methyl (meth)acrylate, butyl (meth)acrylate, benzyl (meth)acrylate, cyclohexyl (meth)acrylate, tetrahydrofurfuryl (meth)acrylate, methoxybutyl (meth)acrylate, trimethylolpropane diallylether mono(meth)acrylate, 1,6-hexanediol di(meth)acrylate, glycerol di(meth)acrylate, trimethylolpropane tri(meth)acrylate, pentaerythritol tri(meth)acrylate, pentaerythritol tetra(meth)acrylate, dipentaerythritol penta(meth)acrylate;

(4) Allyl compounds such as allyl methacrylate and triallyl isocyanurate;

(5) $\alpha,\beta$-Ethylenically unsaturated nitriles such as acrylonitrile;

(6) $\alpha,\beta$-Ethylenically unsaturated amides such as acrylamide and N-butoxymethylacrylamide;

(7) Diesters of $\alpha,\beta$-ethylenically unsaturated polycarboxylic acids such as diethyl itaconate, dibutyl itaconate, diethyl fumarate, dibutyl fumarate, dimethyl maleate and dibutyl maleate, etc.

Among them, the use of polyfunctional compounds having an $\alpha,\beta$-ethylenic unsaturation is favorable in view of a higher hiding power and a better appearance.

Still, they may be employed alone or in combination depending on the purpose of the use of the coating composition to be prepared, since the properties of the coating film are varied by the combination of these $\alpha,\beta$-ethylenically unsaturated compounds with the said photo-curable, urethane-modified polymers as the component (1).

As the photo-sensitizer as the component (3), there may be used a conventional one such as bnezoin, benzoin ethers, benzophenone, benzil, 2,4-dichlorobenzaldehyde or disulfides, or their mixture.

In the composition of the invention, the proportion of the photo-curable, urethane-modified polymer (1), the $\alpha,\beta$-ethylenically unsaturated compound (2) and the photo-sensitizer (3) may be 20–99:80–1:0.01–20 by weight, preferably 40–90:60–10:0.1–10 by weight. When the proportion of the photo-curable, urethane-modified polymer is smaller than the said lower limit, the coating composition becomes hardly cured and, as the result, the coating film has a low hiding power or drawbacks such as poor appearance and inferior physical properties. The use of the $\alpha,\beta$-ethylenically unsaturated compound in a larger amount is desirable for enhancing the curing property and decreasing the viscosity of the photo-curable composition. When the photo-sensitizer is smaller than the said lower limit, the curing proceeds with difficulty. Even if the amount exceeds the said upper limit, any change in the curing property is not expected, and the use of such large amount of the agent is not economical.

When desired, the composition of the invention may be diluted with an organic solvent inert to ultraviolet rays. It can be used not only for an enamel but also for a clear coating.

As stated above, the incorporation of a coloring agent of low ultraviolet ray transmittance into a conventional photo-curable composition has caused a great drawback, and the resulting composition has not been practically utilizable. According to the present invention, however, any kind of coloring agent can be used for the purpose of colored coating. When a coloring agent having a higher ultraviolet ray transmittance (e.g. prussian blue, ultramarine, cadmium pigment) is employed, it may be incorporated in a higher concentration. When a coloring agent having a lower ultraviolet ray transmittance (e.g. phthalocyanine blue, phthalocyanine green) is employed, it may be incorporated in a lower concentration. Although the amount of the coloring agent depends on the kind of the coloring agent or the film thickness, it is usually 150 parts by weight or less, preferably in a range of 3 to 50 parts by weight, to 100 parts by weight of the composition, i.e. the combined amount of the three essential components (1), (2) and (3) in order to assure a sufficient hiding. When the amount of the coloring agent is smaller than the said lower limit, the coating film necessitated for hiding is made thicker. When the amount exceeds the said upper limit, the curing property at the film thickness necessaary for assurance of good film properties is lowered and the film appearance is made bad. In case of requiring a thin coating film, however, the coloring agent may be used in an amount larger than the said upper limit.

The preparation of the coating composition of the invention may be carried out by mixation of the photo-curable, urethane-modified polymer (1), the $\alpha,\beta$-ethylenically unsaturated compound (2) and the photo-sensitizer (3), when used, with the coloring agent (4) by the aid of a conventional dispersing machine such as a ball mill or a three roll mill.

The coating composition may be applied on a substrate by a conventional procedure and then irradiated by ultraviolet rays for curing. If necessary, the substrate applied the composition may be allowed to stand prior to the irradiation so as to evaporate the organic solvent which may be present in the composition. Practically, the irradiation may be performed by exposing the substrate applied the composition to the sun shine or an artificial light of 250 to 500 m$\mu$, preferably 300 to 400 m$\mu$, in wave length. As the light source, there may be used a carbon arc lamp, an ultrahigh pressure mercury lamp, a high pressure mercury lamp, a medium pressure mercury lamp, a low pressure mercury lamp, a metal halide lamp, a xenone lamp, a chemical lamp or the like.

The composition of the invention can be used not only in the field of paints but also in any other field such as inks. It is particularly useful when a coloring agent having a low ultraviolet ray transmittance is required to be incorporated therein, because a good appearance and excellent physical properties of the coating film can be assured.

Reference Example 1

In a flask equipped with a stirrer, there are charged xylylene diisocyanate (a mixture of $\omega, \omega'$-diisocyanato-1,3-dimethylbenzene and $\omega,\omega'$-diisocyanato-1,4-dimethylbenzene) (180 parts) and hydroquinone (0.16 part), and the contents are stirred while cooling with water to keep below 70° C. A mixture of 2-hydroxyethyl methacrylate (130 parts), dibutyltin dilaurate (0.63 part) and hydroquinone (0.16 part) is dropwise added thereto over about 1.5 hours. After the addition, the resultant mixture is aged for about 30 minutes to obtain an isocyanate compound having an unsaturation of the methacrylate moiety.

Reference Example 2

In a flask equipped with a stirrer, there are charged glycidyl methacrylate (156 parts), dibutyltin dilaurate (0.12 part) and hydroquinone (0.24 part). To the mixture, methacrylic acid (86 parts) is dropwise added at 100° to 115° C. over about 2 hours under nitrogen atmosphere. The reaction is effected at the same temperature until the acid value becomes 2 or less. The reaction mixture is cooled to room temperature, and dibutyltin dilaurate (0.63 part) and hydroquinone (0.23 part) are added thereto. The obtained mixture is dropwise added to a flask equipped with a stirrer which contains isophorone diisocyanate (222.3 parts) and hydroquinone (0.23 part), and the resulting mixture is aged as in Reference Example 1 to obtain an isocyanate compound having an unsaturation of the methacrylate moiety.

Reference Example 3

In a flask equipped with a stirrer, there are charged phthalic anhydride (296 parts), tetrahydrophthalic anhydride (304 parts), adipic acid (292 parts), ethylene glycol (62 parts), "Cardura E" (490 parts), "Epiclon" (molecular weight, 360; epoxy equivalent, 180) (720 parts) and toluene (73.4 parts), and the contents are reacted at 150° C. under nitrogen atmosphere until the acid value becomes 58 or less to obtain a polyester polyol. After the temperature is lowered to 130° C., glycidyl methacrylate (284 parts), triphenyl phosphite (12 parts) and hydroquinone (1.2 parts) are added thereto, and the reaction is effected at 130° C. until the acid value becomes 10 or less to obtain an unsaturated polyester polyol.

Reference Example 4

In a flask equipped with a stirrer, the unsaturated polyester polyol (2534.6 parts) prepared in Reference Example 3 is charged and stirred at 110° C. under nitrogen atmosphere. The isocyanate compound obtained in Reference Example 1 (311 parts) is dropwise added thereto over about 1 hour, and the reaction is effected for 3 to 10 hours to give a polymer which shows a ratio of the molecular weight to the number of the unsaturation of the methacrylate moiety of 919. After confirming the complete reaction of the isocyanate group, methyl methacrylate (638 parts) and hydroquinone (1.4 parts) are added to the reaction mixture to obtain an urethane-modified polymer composition.

Reference Example 5

The unsaturated polyester polyol (2534.6 parts) prepared in Reference Example 3 and the isocyanate compound (622 parts) obtained in Reference Example 1 are reacted as in Reference Example 4 to give a polymer which shows a ratio of the molecular weight to the number of the unsaturation of the methacrylate moiety of 767. Methyl methacrylate (716 parts) and hydroquinone (1.5 parts) are added to the reaction mixture to obtain an urethane-modified polymer composition.

Reference Example 6

The unsaturated polyester polyol (2534.6 parts) prepared in Reference Example 3 and the isocyanate compound (933 parts) obtained in Reference Example 1 are reacted as in Reference Example 4 to give a polymer which shows a ratio of the molecular weight to the number of the unsaturation of the methacrylate moiety of 676. Methyl methacrylate (793.6 parts) and hydroquinone (1.7 parts) are added to the reaction mixture to obtain an urethane-modified polymer composition.

Reference Example 7

The unsaturated polyester polyol (2534.6 parts) prepared in Reference Example 3 and the isocyanate compound (1244 parts) obtained in Reference Example 1 are reacted as in Reference Example 4 to give a polymer which shows a ratio of the molecular weight to the number of the unsaturation of the methacrylate moiety of 615. Methyl methacrylate (850 parts) and hydroquinone (1.7 parts) are added to the reaction mixture to obtain an urethane-modified polymer composition.

Reference Example 8

The unsaturated polyester polyol (2534.6 parts) prepared in Reference Example 3 and the isocyanate compound (1555 parts) obtained in Reference Example 1 are reacted as in Reference Example 4 to give a polymer which shows a ratio of the molecular weight to the number of the unsaturation of the methacrylate moiety of 571. Methyl methacrylate (908 parts) and hydroquinone (2.0 parts) are added to the reaction mixture to obtain an urethane-modified polymer composition.

Reference Example 9

The unsaturated polyester polyol (2534.6 parts) prepared in Reference Example 3 and the isocyanate compound (931.5 parts) obtained in Reference Example 2 are reacted as in Reference Example 4 to give a polymer which shows a ratio of the molecular weight to the number of the unsaturation of the methacrylate moiety of 558. Methyl methacrylate (728 parts) and hydroquinone (1.5 parts) are added to the reaction mixture to obtain an urethane-modified polymer composition.

Reference Example 10

In a flask equipped with a stirrer, there are charged tetrahydrophthalic anhydride (152 parts), 2-hydroxyethyl methacrylate (143 parts) and hydroquinone (0.28 part), and the contents are stirred at 120° C. A mixture of glycidyl methacrylate (142 parts), hydroquinone (0.14 part) and triethylamine (2.11 parts) is dropwise added thereto over about 1 hour, and the resultant mixture is reacted at the same temperature until the acid value becomes 9 or less. The reaction mixture is cooled to room temperature, and dibutyltin dilaurate (0.63 part) and hydroquinone (0.3 part) are added thereto. The obtained mixture is reacted with xylylene diisocyanate (180 parts) and hydroquinone (0.3 part) in a flask equipped with a stirrer as in Reference Example 1 to obtain an isocyanate compound.

Reference Example 11

In a flask equipped with a stirrer, there are charged methyl methacrylate (340 parts), styrene (100 parts), n-butyl acrylate (50 parts), 2-hydroxyethyl methacrylate (10 parts), laurylmercaptan (1 part) and toluene (350 parts), and the contents are stirred at 100° to 110° C. in nitrogen atmosphere. A mixture of 2,2'-azobisisobutyronitrile (5 parts) and toluene (150 parts) is dropwise added thereto over about 3 hours. The resultant mixture is aged at the same temperature for 2 hours to obtain an acrylic polyol having a number average molecular weight of 17,000. To the thus obtained acrylic polyol, methyl methacrylate (129 parts) and hydroquinone (0.26 part) are added, and the mixture is reacted with the isocyanate compound (15.9 parts) prepared in Reference Example 10 in the same manner as in Reference Example 4 to give an urethane-modified polymer composition containing a polymer which shows a ratio of the molecular weight to the number of the unsaturation of the methacrylate moiety of 9521.

EXAMPLE 1

The polymer composition obtained in Reference Example 7 (125 parts), triallyl isocyanurate (25 parts), benzoin methyl ether (2.5 parts) and titanium oxide ("Tioxide R-CR 3" manufactured by British Titan Products Corp.) (12.5 parts) are dispersed to obtain a coating composition. The thus prepared composition is applied on a clean polished plate of steel. After allowed to stand for 10 minutes, the plate is subjected to irradiation by a high pressure mercury lamp (2 KW, one lamp) for 3 minutes at a distance of 15 cm to form a coating film.

EXAMPLE 2

As in Example 1, the polymer composition obtained in Reference Example 7 (125 parts), triallyl isocyanurate (50 parts), benzoin methyl ether (3 parts) and "Tioxide R-CR 3" (15 parts) are dispersed to make a coating composition, from which a coating film is prepared.

EXAMPLE 3

As in Example 1, the polymer composition obtained in Reference Example 7 (125 parts), trimethylolpropane trimethacrylate (25 parts), benzoin methyl ether (2.5 parts) and "Tioxide R-Cr 3" (12.5 parts) are dispersed to make a coating composition, from which a coating film is prepared.

EXAMPLE 4

As in Example 1, the polymer composition obtained in Reference Example 7 (125 parts), trimethylolpropane trimethacrylate (50 parts), benzoin methyl ether (3 parts) and "Tioxide R-CR 3" (15 parts) are dispersed to make a coating composition, from which a coating film is prepared.

EXAMPLE 5

As in Example 1, the polymer composition obtained in Reference Example 4 (125 parts), trimethylolpropane trimethacrylate (50 parts), benzoin methyl ether (2.5 parts) and "Tioxide R-CR 3" (10 parts) are dispersed to make a coating composition, from which a coating film is prepared. Up to a thickness of the film being 80µ, curing is effected without any undesirable change on the surface. The pencil hardness is B.

EXAMPLE 6

As in Example 1, the polymer composition obtained in Reference Example 5 (125 parts), trimethylolpropane trimethacrylate (50 parts), benzoin methyl ether (2.5 parts) and "Tioxide R-CR 3" (10 parts) are dispersed to make a coating composition, from which a coating film is prepared. Up to a thickness of the film being 85, curing is effected without any undesirable change on the surface. The pencil hardness is H.

EXAMPLE 7

As in Example 1, the polymer composition obtained in Reference Example 6 (125 parts), trimethylolpropane trimethacrylate (50 parts), benzoin methyl ether (2.5 parts) and "Tioxide R-CR 3" (10 parts) are dispersed to make a coating composition, from which a coating film is prepared. Up to a thickness of the film being 100µ, curing is effected without any undesirable change on the surface. The pencil hardness is H.

EXAMPLE 8

As in Example 1, the polymer composition obtained in Reference Example 11 (222 parts), N-butoxymethylacrylamide (25 parts), benzoin methyl ether (2.5 parts) and cobalt blue (60 parts) are dispersed to make a coating composition, from which a coating film is prepared. Up to a thickness of the film being 110µ, curing is effected without any undesirable change on the surface. The pencil hardness is H. The thickness of the film required for hiding is 100µ, when calculated from the value determined by the aid of a cryptometer.

EXAMPLE 9

As in Example 1, the polymer composition obtained in Reference Example 8 (125 parts), trimethylolpropane trimethacrylate (25 parts), methyl methacrylate (25 parts), benzoin methyl ether (2.5 parts) and an organic red pigment ("Colofine Red 236" manufactured by Dainippon Ink & Chemicals Inc.) (20 parts) are dispersed to make a coating composition, from which a coating film is prepared. Up to a thickness of the film being 100µ, curing is effected without any undesirable change on the surface. The pencil hardness is H. The thickness of the film required for hiding is 90µ, when calculated from the value determined by the aid of a cryptometer.

EXAMPLE 10

As in Example 1, the polymer composition obtained in Reference Example 7 (125 parts), trimethylolpropane trimethacrylate (25 parts), benzoin methyl ether (2.5 parts) and an organic orange pigment ("Chlorol Orange Y KO-789-D" manufactured by DuPont) (20 parts) are dispersed to make a coating composition, from which a coating film is prepared. Up to a thickness of the film being 90μ, curing is effected without any undesirable change on the surface. The pencil hardness is 2H. The thickness of the film required for hiding is 50μ, when calculated from the value determined by the aid of a cryptometer.

EXAMPLE 11

As in Example 1, the polymer composition obtained in Reference Example 7 (125 parts), tetrahydrofurfuryl methacrylate (25 parts), styrene (25 parts), benzoin isopropyl ether (2.5 parts) and an inorganic black pigment ("Cobalt Black XD-3493" manufactured by Kyokujitsu Sangyo Co., Ltd.) (40 parts) are dispersed to make a coating composition, from which a coating film is prepared. Up to a thickness of the film being 100μ, curing is effected without any undesirable change on the surface. The pencil hardness is H. The thickness of the film required for hiding is 80μ, when calculated from the value determined by the aid of a cryptometer.

EXAMPLE 12

As in Example 1, the polymer composition obtained in Reference Example 9 (125 parts), trimethylolpropane trimethacrylate (25 parts), methyl methacrylate (25 parts), benzoin methyl ether (2.5 parts) and red iron oxide ("Tenyo Bengara No. 501" manufactured by Tone Sangyo Co., Ltd.) (10 parts) are dispersed to make a coating composition, from which a coating film is prepared. Up to a thickness of the film being 80μ, curing is effected without any undesirable change on the surface. The pencil hardness is H. The thickness of the film required for hiding is 40μ, when calculated from the value determined by the aid of a cryptometer.

Control Example 1

Unsaturated polyester resin ("Goselack 750" manufactured by Nippon Synthetic Chemical Industry Co., Ltd.) (solid content, 100 parts), styrene (25 parts), benzoin methyl ether (2.5 parts) and "Tioxide R-CR 3" (12.5 parts) are dispersed as in Example 1 to make a coating composition.

Control Example 2

"Goselack 750" (solid content, 100 parts), triallyl isocyanurate (50 parts), benzoin methyl ether (3 parts) and "Tioxide R-CR 3" (15 parts) are dispersed as in Example 1 to make a coating composition.

Control Example 3

"Goselack 750" (solid content, 100 parts), trimethylolpropane trimethacrylate (25 parts), benzoin methyl ether (2.5 parts) and "Tioxide R-CR 3" (12.5 parts) are dispersed as in Example 1 to make a coating composition.

The properties of the coating films formed by the use of Examples 1 to 4 and Control Examples 1 to 3 are shown in Table 1.

Table 1

| Properties of coating film | Example No. | | | | Control Example No. | | |
|---|---|---|---|---|---|---|---|
| | 1 | 2 | 3 | 4 | 1 | 2 | 3 |
| Maximum thickness* (μ) | 50 | 60 | 70 | 90 | 28 | 25 | 20 |
| Pencil hardness** | H | 2B | H | HB | 5B | 2B | H |
| Alkali resistance 1% NaOH, 40° C., 24 hrs*** | Excellent | Good | Excellent | Excellent | — | — | — |

Note:
*Maximum thickness of the coating film not producing any abnormality such as crepe-like appearance or wrinkle formation (macroscopically observed).
**Hardness of the coating film having the maximum thickness.
***Observation of the coating and discoloration.

As examples of the coloring agent which may be incorporated into the coating composition of the invention, there are those as described in "Pigment Handbook" edited by Temple C. Patton, Volume 1 (published by Jone Wiley & Sons, Inc., New York), particularly those classified under the headings "White (Hiding or Prime) Pigments" (e.g. titanium dioxide, zinc oxide and leaded zinc oxide, zinc sulfide, lithopone, basic lead carbonate, basic lead sulfate, basic lead silicate, basic lead silico sulfate, dibasic lead phosphite, antimony oxide, zirconium oxide and zircon, potassium titanate), "Color Pigments, Inorganic" (e.g. colored iron oxide pigments (natural), colored iron oxide pigments (synthetic), chromium oxides, lead chromates, molybdate orange, chrome green pigments, cadmium sulfide pigments, cadmium/mercury sulfides, ferriferrocyanide pigments (iron blue), ultramarine pigments, mercuric sulfide (vermilion), synthetic inorganic complexes), "Color Pigments, Organic" (e.g. pigment green B (nitroso pigment), lake of acid yellow 1 (nitro pigment), hanza yellow and orange pigments, orthonitraniline and dinitraniline oranges, toluidine, para and chlornitraniline reds, naphthol red and brown pigments, nickel azo yellow, helio bordeaux BL, persion orange lake, red lake C, lithol and rubine pigments, miscellaneous BON pigments, pigment scarlet 3B lake, scarlet 2R lake, tartrazine and anthosine lakes, benzimidazolone pigments, diarylide yellow and orange pigments, pyrazolone pigments, dianisidine blue, diazo condensation pigments, basic dye pigments, alkali blues, peacock blue lake, phloxine, quinacridones, lake of acid yellow 3, carbazole dioxazine violet, alizarine lake, vat pigments, phthalocyanines, carmine lake, tetrachloroisoindolinones), "Black Pigments" (e.g. carbon black pigments, graphite, black iron oxides, copper/chrome complex black, aniline black, logwood black), "Metallic Pigments" (e.g. aluminum flake pigment, copper and copper alloy flake powders, zinc pigment (zinc dust), stainless steel flake pigment), "Metal Protective (Anticorrosive) Pigments Other Than Metallic Powders" (e.g. red lead, basic lead silico chromate, zinc and strontium chromates, white molybdate pigments, calcium plumbate) and "Nacreous (Perlescent) Pigments".

What is claimed is:

1. A photo-curable composition having a high hiding power which comprises
    (1) a photo-curable, urethane-modified polymer having at least one unsaturation unit of an acrylate or methacrylate type moiety in the side chain and a molecular weight such that the weight of the polymer per single unsaturation unit is 200–10,000, said photocurable, urethane-modified polymer being produced by reacting (A) an isocyanate compound having at least one unsaturation unit of an acrylate or methacrylate type moiety with (B) a polymer having at least one active hydrogen atom, said isocyanate compound (A) being produced by reacting (C) an acrylate or methacrylate compound having at least one acrylate or methacrylate moiety and at least one active hydrogen atom with (D) a polyfunctional isocyanate having isocyanate groups bonded directly to the carbon atom, (2) an $\alpha,\beta$-ethylenically unsaturated compound,
(3) a photo-sensitizer, and
(4) a coloring agent having ultraviolet ray transmitting properties, wherein the weight ratio of the photo-curable, urethane-modified polymer (1), the $\alpha,\beta$-ethylenically unsaturated compound (2) and the photo-sensitizer (3) is 20–99:80–1:0.01–20 and wherein the amount of coloring agent is 3 to 50 parts by weight to 100 parts by weight of the combined amount of the photo-curable, urethane-modified polymer (1), the $\alpha,\beta$-ethylenically unsaturated compound (2) and the photo-sensitizer (3).

2. The photo-curable composition according to claim 1, wherein the acrylate or methacrylate compound (C) is a member selected from the group consisting of monoacrylic esters and monomethacrylic ethacrylic esters of alkanepolyols containing not more than 10 carbon atoms and not more than 10 hydroxyl groups.

3. The photo-curable composition according to claim 1, wherein the acrylate or methacrylate compound (C) is a member selected from the group consisting of monoacrylic esters and methacrylic esters of polyalkylene glycols having a molecular weight of not more than 400.

4. The photo-curable composition according to claim 1, wherein the acrylate or methacrylate compound (C) is a member selected from the group consisting of monoacrylic esters and monomethacrylic esters of N-alkylated dialkanolamines having not more than 10 carbon atoms.

5. The photo-curable composition according to claim 1, wherein the acrylate or methacrylate compound (C) is a reaction product of acrylic acid or methacrylic acid with a monoepoxy compound having a molecular weight of not more than 400.

6. The photo-curable composition according to claim 1, wherein the acrylate or methacrylate compound (C) is a reaction product of glycidyl acrylate or methacrylate with a monocarboxylic acid having a molecular weight of not more than 300.

7. The photo-curable composition according to claim 1, wherein the acrylate or methacrylate compound (C) is a reaction product of glycidyl acrylate or methacrylate with a secondary monoamine having a molecular weight of not more than 500.

8. The photo-curable composition according to claim 1, wherein the polyfunctional isocyanate (D) is a member selected from the group consisting of hexamethylene diisocyanate, 2,4-tolylene diisocyanate, 2,6-tolylene diisocyanate, isophorone diisocyanate, $\omega,\omega'$-diisocyanato-1,3-dimethylbenzene, $\omega,\omega'$-diisocyanato-1,4-dimethylbenzene or their mixture, 4,4'-methylenebis(phenyl isocyanate), 4,4'-methylenebis(cyclohexyl isocyanate), 1-methyl-2,4-diisocyanatocyclohexane, 1-methyl-2,6-diisocyanatocyclohexane and lysine diisocyanate.

9. The photo-curable composition according to claim 1, wherein the polymer (B) is a member selected from the group consisting of polyesterpolyols having a molecular weight of about 500 to 10,000, such polyesterpolyols having an $\alpha,\beta$-ethylenic unsaturation, acrylic polyols having a molecular weight of about 500 to 30,000 produced by copolymerization of alkylene glycol monoacrylate or monomethacrylate with $\alpha,\beta$-ethylenically unsaturated compounds, such acrylic polyols having an $\alpha,\beta$-ethylenic unsaturation obtained by half esterification of acrylic polyols with unsaturated polycarboxylic anhydrides, esterification of the carboxyl group at the side chain of acrylic polyols with $\alpha,\beta$-ethylenically unsaturated epoxy compounds or esterification of the glycidyl group at the side chain of an acrylic polyols with $\alpha,\beta$-ethylenically unsaturated carboxylic acids, and polyurethanepolyols obtained by urethanation of said polyesterpolyols or acrylic polyols with polyisocyanates.

10. The photo-curable composition according to claim 1, wherein the polymer (B) is a polyetherpolyol obtained by reacting ethylene oxide, propylene oxide or tetrahydrofuran with a polyol selected from the group consisting of ethyleneglycol, diethyleneglycol, trimethylolpropane, 1,3-butanediol, 1,4-butanediol, 1,6-hexanediol, 1,2,6-hexanetriol, pentaerythritol, sorbitol, sorbitan and sucrose.

11. The photo-curable composition according to claim 1, wherein the polymer (B) is an ester having a molecular weight of about 500 to 4,000 obtained by esterification of a polyol with a higher fatty acid.

12. The photo-curable composition according to claim 1, wherein the proportion of the polymer (1), the monomer (2) and the photo-sensitizer (3) is 40–90:60–10:0.1–10 by weight.

13. The photo-curable composition according to claim 1, wherein the coloring agent is of low ultraviolet ray transmittance.

* * * * *